(12) United States Patent
Miyahara

(10) Patent No.: US 8,497,717 B2
(45) Date of Patent: Jul. 30, 2013

(54) REFERENCE FREQUENCY GENERATING DEVICE

(75) Inventor: Kazunori Miyahara, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 147 days.

(21) Appl. No.: 13/257,845

(22) PCT Filed: Apr. 15, 2010

(86) PCT No.: PCT/JP2010/056765
§ 371 (c)(1),
(2), (4) Date: Sep. 20, 2011

(87) PCT Pub. No.: WO2010/137419
PCT Pub. Date: Dec. 2, 2010

(65) Prior Publication Data
US 2012/0007642 A1   Jan. 12, 2012

(30) Foreign Application Priority Data

May 25, 2009  (JP) ................................ 2009-125727

(51) Int. Cl.
*H03L 7/06* (2006.01)
(52) U.S. Cl.
USPC ..................................... 327/156; 327/147
(58) Field of Classification Search
USPC ................................................ 327/147, 156
See application file for complete search history.

(56) References Cited

U.S. PATENT DOCUMENTS

| 6,734,741 B2 | 5/2004 | Staszewski et al. |
| 6,791,422 B2 | 9/2004 | Staszewski et al. |
| 6,909,336 B1 * | 6/2005 | Rajagopalan et al. ........ 331/183 |
| 6,917,317 B2 * | 7/2005 | Nagaso et al. ................ 341/131 |
| 7,292,618 B2 * | 11/2007 | Tal et al. ....................... 375/132 |

(Continued)

FOREIGN PATENT DOCUMENTS

| JP | 2-100518 | 4/1990 |
| JP | 4-50935 | 4/1992 |

(Continued)

OTHER PUBLICATIONS

D. Hermansen et al. "A 0.18 μm CMOS Digitally Controlled Oscillator for Closed-Loop Modulation Systems," downloaded from web site: http://www.rtx.dk/Files/Filer/PDF/controlled.pdf, printout date: May 23, 2006, article date or initial posting date: both unknown, 6 pages. cited by other.
HP SmartClock Technology-Application, Mar. 1998.
L. Xu, "All Digital PLL for RF Transmitter," Sep. 19, 2006.
L. Xu, S-87.4198 Postgraduate Course in Electronic Circuit Design II, "Digitally Controlled Oscillator", May 18, 2006.
R. Staszewski, "Digitally-Intensive Transceiver for GSM/EDGE," Jun. 7, 2005.

*Primary Examiner* — Adam Houston
(74) *Attorney, Agent, or Firm* — Birch, Stewart, Kolasch & Birch, LLP

(57) ABSTRACT

The disclosed is a reference frequency generating device (11), which includes a GPS receiver (21), a PLL circuit (31), a detector (28), a memory unit (29), and a controller (22). The PLL circuit (31) controls the digitally controlled oscillator (26) based on a synchronizing control signal acquired based on a reference signal from the GPS receiver (21). The memory unit (29) stores a correspondence relation between a control value of the synchronizing control signal, and a voltage value and a temperature at that time. When the reference signal is not acquired, the controller 22 determines a holdover control signal based on the correspondence relation, and the voltage and temperature detected by the detector 28, and controls the digitally controlled oscillator (26).

11 Claims, 6 Drawing Sheets

U.S. PATENT DOCUMENTS

| | | | |
|---|---|---|---|
| 7,336,134 B1 * | 2/2008 | Janesch et al. | 331/36 C |
| 7,692,500 B1 * | 4/2010 | Koukab et al. | 331/17 |
| 7,787,563 B2 * | 8/2010 | Tal et al. | 375/297 |
| 8,339,165 B2 * | 12/2012 | Dunworth et al. | 327/152 |
| 8,411,788 B2 * | 4/2013 | Sahota | 375/295 |
| 2003/0141936 A1 * | 7/2003 | Staszewski et al. | 331/16 |
| 2009/0102570 A1 | 4/2009 | Yoshida et al. | |

FOREIGN PATENT DOCUMENTS

| | | |
|---|---|---|
| JP | 2000-286698 | 10/2000 |
| JP | 2001-274678 | 10/2001 |
| JP | 2002-217722 | 8/2002 |
| JP | 2009-105651 | 5/2009 |

* cited by examiner

REFERENCE FREQUENCY GENERATING DEVICE

TECHNICAL FIELD

The current invention relates to a reference frequency generating device.

RELATED ART

Conventionally, voltage controlled oscillators have been known as oscillators which can change a frequency of an output signal. The voltage controlled oscillator is an oscillator which can change an output frequency according to a control voltage inputted, for example, and what is constructed using a crystal oscillator (Voltage Controlled Crystal Oscillator, VCXO) is known. Generally, in this voltage controlled oscillator, a control voltage pair oscillating frequency characteristic (hereinafter, referred to as an "F-V characteristic") changes with a change of temperature. Therefore, an isothermal-bath type voltage controlled oscillator, having a configuration such that it has a crystal oscillator built in an isothermal bath to keep the temperature constant, has also been developed.

In this voltage controlled oscillator, since the F-V characteristic changes according to the change of temperature as described above and the F-V characteristic also changes with time, it is difficult for the voltage controlled oscillator alone to output highly precise signals. In order to solve this, a reference frequency generating device used in, for example, a base station of a wireless communication system, controls the voltage controlled oscillator so that the signals outputted from the voltage controlled oscillator (or signals obtained by a frequency division of the signals) synchronize with highly precise reference signals acquired from, for example, a GPS (Global Positioning System) receiver, thereby it is configured to output highly precise signals.

Moreover, a reference frequency generating device, which continuously outputs reference frequency signals by performing a holdover control even if it becomes impossible to acquire the reference signals, has also been known. Nonpatent Document 1 discloses such a kind of reference frequency generating device provided with the holdover control capability.

The reference frequency generating device of Nonpatent Document 1 stores a lapsed time and a temperature, and the F-V characteristic under this situation, while synchronizing with the reference signal. Then, when it becomes impossible to acquire the reference signal, it estimates the F-V characteristic from the stored information, and outputs the reference frequency signal by executing the holdover control of the voltage controlled oscillator.

RELATED ART DOCUMENT

Nonpatent Document

Nonpatent Document 1: HP SmartClock Technology-Application Note 1279, Hewlett-Packard Company, Copyright 1998 5966-0431E, p. 5-15.

SUMMARY OF THE INVENTION

Problems to be Solved by the Invention

As described above, the F-V characteristic of the voltage controlled oscillator using the crystal oscillator changes with time and, therefore, an accurate estimation of the characteristic is limited. For this reason, the configuration of Nonpatent Document 1 has room for an improvement against errors of a frequency and a phase increasing with time after starting the holdover control. Furthermore, it is hard to say that the voltage controlled oscillator provided with the crystal oscillator has a usable temperature range which is wide enough (even if it is the isothermal-bath type) and, therefore, a configuration which can be used also in a severer environment has been demanded. The voltage controlled oscillator with the isothermal bath is also required for improvements against that it is expensive, it is difficult to be reduced in size, etc.

The current invention is carried out in view of the above situations, and one object of the invention is to provide a low-cost reference frequency generating device with a wide temperature range, which can output highly precise reference frequency signals over a long period of time, even if it becomes impossible to acquire reference signals.

Means for Solving the Problem and Effect of the Invention

The problem to be solved by the present invention is like the above, and means for solving the problem and its effect are described below.

According to the aspect of the present invention, a reference frequency generating device having the following configurations is provided. That is, the reference frequency generating device includes a synchronizing circuit, a detector, a memory unit, and a controller. The synchronizing circuit controls a digitally controlled oscillator with a first control signal acquired based on a reference signal. The detector detects an environmental value indicative of an environment where the digitally controlled oscillator is used. The memory unit can store a correspondence relation between a control value of the first control signal and the environmental value when the first control signal is determined. The controller determines a second control signal based on the environmental value detected by the detector and the correspondence relation stored in the memory unit when the reference signal cannot be acquired, and controls the digitally controlled oscillator based on the second control signal.

Thereby, while the reference signal is acquirable, the digitally controlled oscillator is controllable with the first control signal of the synchronizing circuit with high precision. On the other hand, even if it becomes impossible to acquire the reference signal, the controller can control the digitally controlled oscillator with high precision based on the second control signal. Moreover, since the digitally controlled oscillator can be constructed from semiconductor(s), their usable temperature ranges are wide and it can have a configuration which is strong against a shock and vibration. Furthermore, even if time passes, the device can have a configuration where characteristics of the digitally controlled oscillator are hard to change.

In the reference frequency generating device, it may be preferred that the correspondence relation stored in the memory unit is obtained in a state where the reference signal is synchronized with the signal outputted from the digitally controlled oscillator by the synchronizing circuit.

Thereby, since the correspondence relation can be obtained with high precision, when it becomes impossible to acquire the reference signal, the digitally controlled oscillator can be controlled with better accuracy.

In the reference frequency generating device, it may be preferred that the digitally controlled oscillator includes a delay element.

Thereby, since the frequency of the output of the digitally controlled oscillator is directly controllable, the highly precise frequency signal can be generated.

In the reference frequency generating device, it may be preferred that the digitally controlled oscillator is a ring oscillator.

Thereby, since the digitally controlled oscillator can have a configuration easy to be achieved with the digital circuit(s), it can be a much more suitable configuration for downsizing and mass production.

In the reference frequency generating device, it may be preferred that the detector detects at least one of a voltage value and a temperature as the environmental value.

Thereby, it can obtain the correspondence relation about the environmental factor which is easy to affect the characteristics of the digitally controlled oscillator to determine the second control signal.

In the reference frequency generating device, it may be preferred that the synchronizing circuit includes a phase comparator for measuring a phase difference between the reference signal and the signal outputted from the digitally controlled oscillator, by using a TDC.

Thereby, since the phase comparator can have a configuration easy to be achieved with digital circuit(s), downsizing and power-saving are realizable.

In the reference frequency generating device, it may be preferred that the TDC measures the phase difference using a delay amount of the phase comparison delay element.

Thereby, by using the phase comparison delay element having a small delay amount, the phase difference can be measured with high precision.

In the reference frequency generating device, the memory unit may store the correspondence relation before the reference frequency generating device operates for the first time.

Thereby, even when it becomes impossible to acquire the reference signal immediately after the device is moved, the controller can determine the second control signal to control the digitally controlled oscillator.

In the reference frequency generating device, it may be preferred that the stored content of the memory unit is updatable with the correspondence relation that newly obtained during an operation of the reference frequency generating device.

Thereby, the latest characteristic of the digitally controlled oscillator can be obtained from the newly acquired correspondence relation.

In the reference frequency generating device, it may be preferred that a signal outputted from the digitally controlled oscillator is used as the reference frequency signal.

Thereby, the highly precise reference frequency signal can be outputted with an easy configuration based on the reference signal or the correspondence relation.

However, in the reference frequency generating device, the synchronizing circuit may include a voltage controlled oscillator for outputting a signal that is synchronized with the signal outputted from the digitally controlled oscillator. The signal outputted from the voltage controlled oscillator may be used as the reference frequency signal.

Thereby, jitter contained in the output signal of the digitally controlled oscillator can be removed, and the stable reference frequency signal can be outputted.

BEST MODE OF CARRYING OUT THE INVENTION

Figure 1:
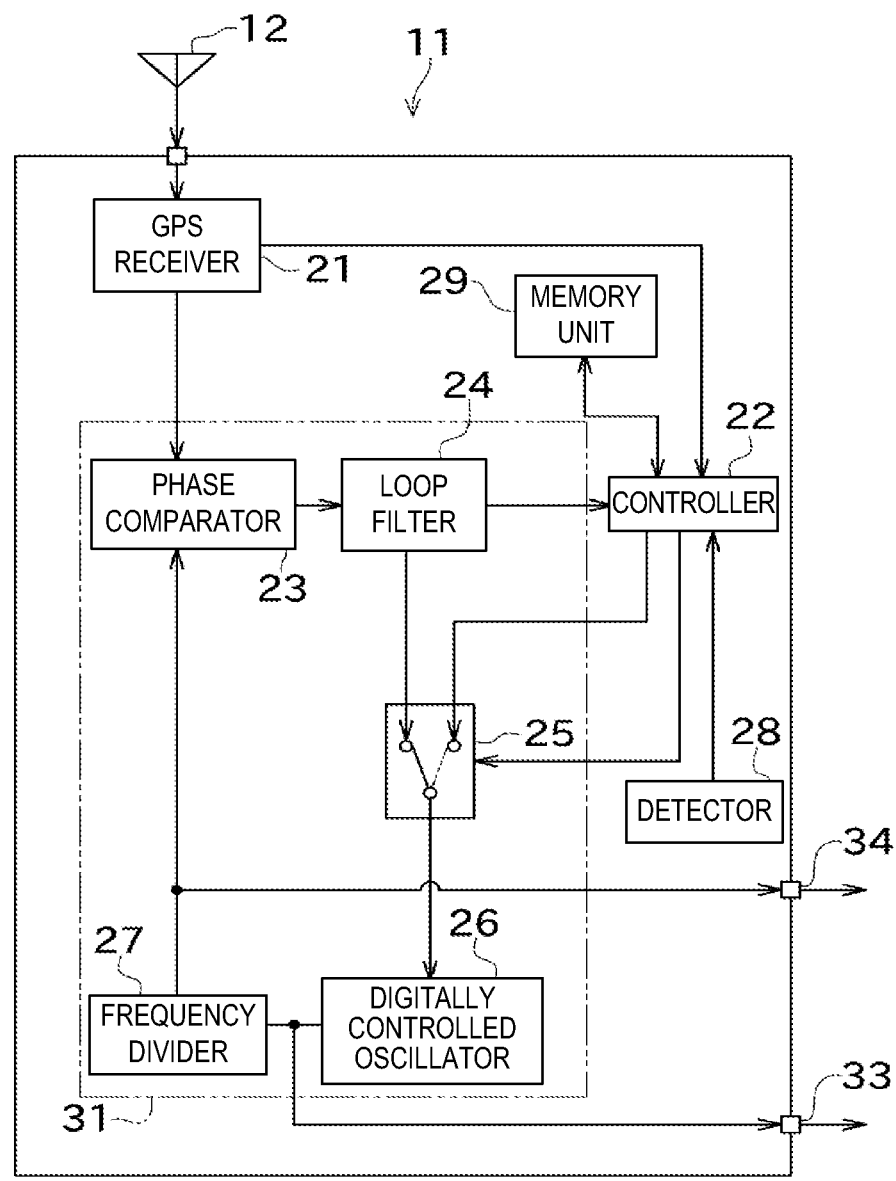
FIG. 1 is a block diagram schematically showing a reference frequency generating device according to this embodiment.
Figure 2:
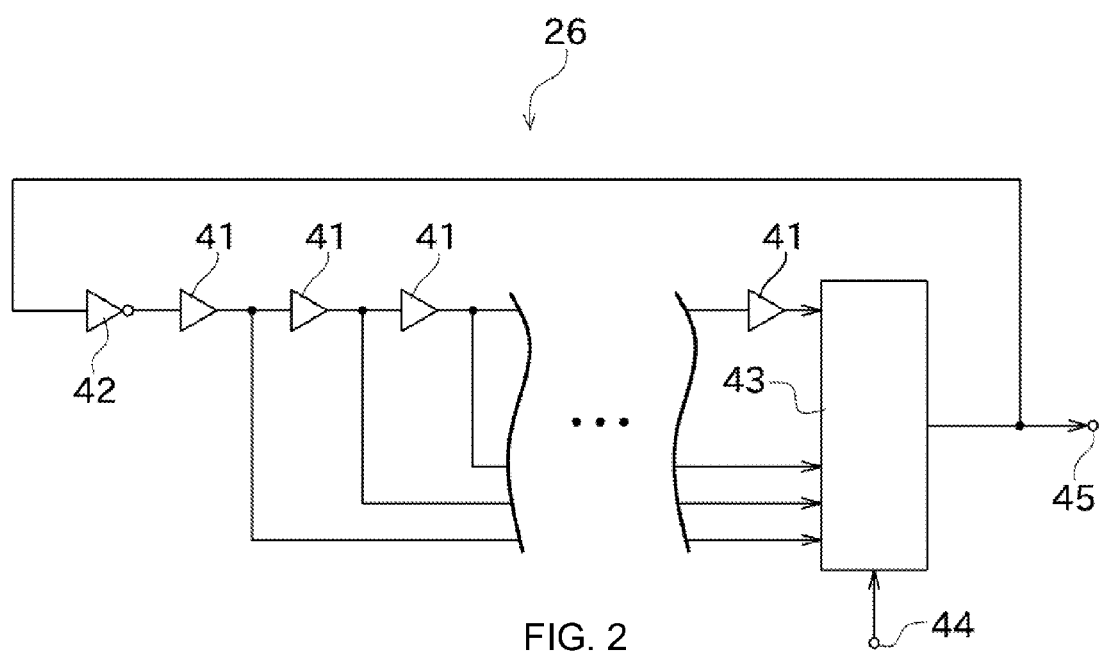
FIG. 2 is a particular circuit diagram of a digitally controlled oscillator of this embodiment.
Figure 3:
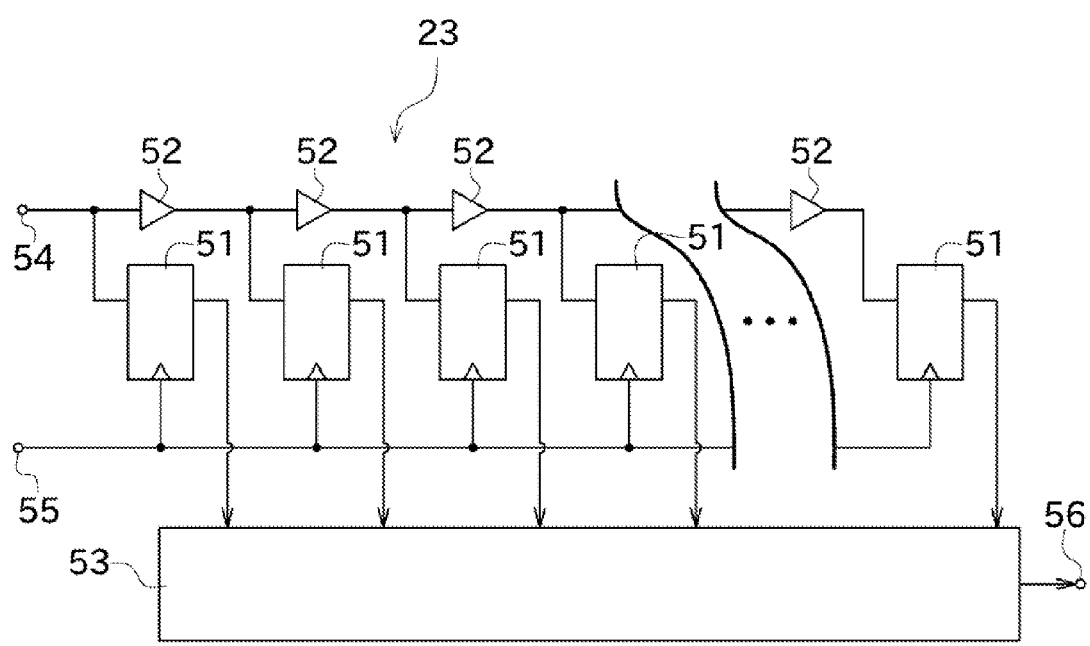
FIG. 3 is a particular circuit diagram of a phase comparator of this embodiment.
Figure 4:
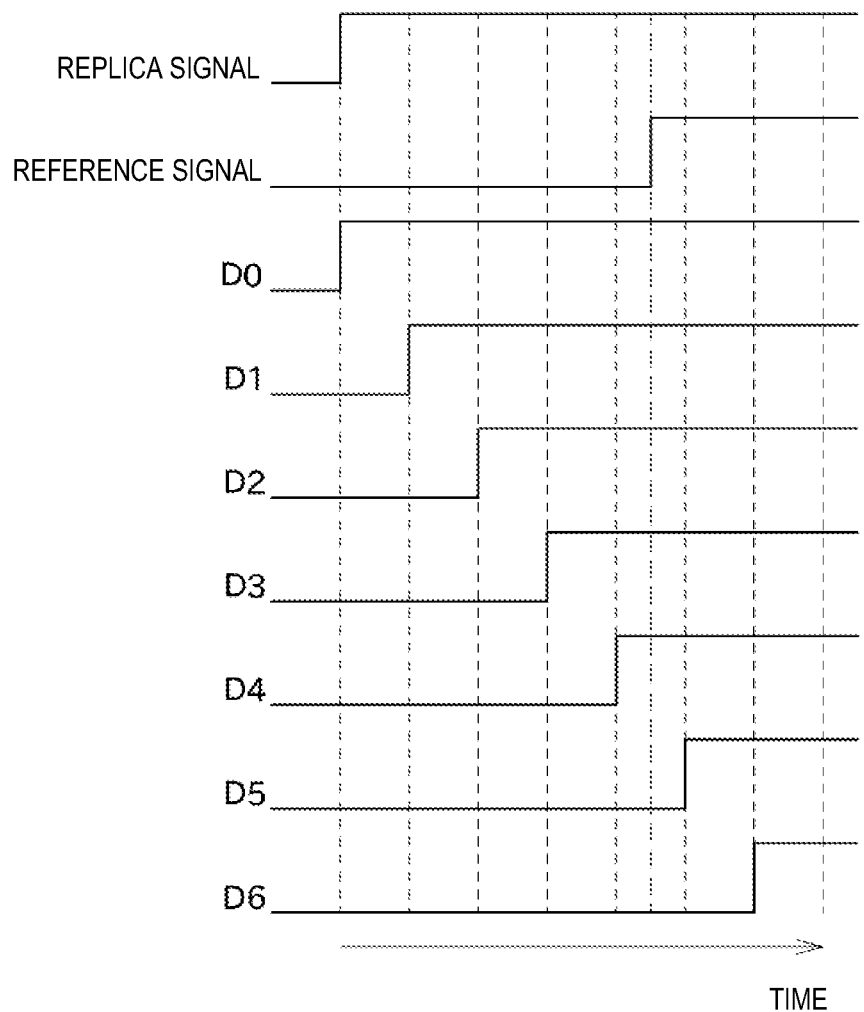
FIG. 4 is a diagram conceptually illustrating a method of measuring a phase difference using phase comparison delay elements of the phase comparator of this embodiment.

Next, one embodiment of the present invention is described with reference to the drawings. FIG. 1 is a block diagram schematically showing a reference frequency generating device 11 of this embodiment. FIG. 2 is a particular circuit diagram of a digitally controlled oscillator 26 of this embodiment. FIG. 3 is a particular circuit diagram of a phase comparator 23 of this embodiment. FIG. 4 is a diagram conceptually illustrating a method of measuring phase differences using phase comparison delay elements 52 of the phase comparator 23 of this embodiment.

The reference frequency generating device 11 of this embodiment is used for base stations of a cellular phone system, transmitting stations of ground digital broadcasting, WiMAX (Worldwide Interoperability for Microwave Access) communication equipment, etc. This reference frequency generating device 11 functions as a master clock generator, and provides reference frequency signals to certain user side apparatuses connected with the reference frequency generating device 11. Below, a configuration of each component of the reference frequency generating device 11 is described.

As shown in FIG. 1, the reference frequency generating device 11 of this embodiment includes a GPS receiver 21, the digitally controlled oscillator 26, a frequency divider 27, the phase comparator 23, a loop filter 24, a detector 28, a controller 22, and a switch circuit 25, as its primary configuration.

The GPS receiver 21 is electrically connected with a GPS antenna 12 installed outside the reference frequency generating device 11. The GPS receiver 21 performs a positioning calculation based on positioning signals received with the GPS antenna 12, and based on this, it generates reference signals (one pulse signal per second). The GPS receiver 21 suitably calibrates the reference signals at 1 Hz so that the reference signals synchronize accurately with each second of the Coordinated Universal Time (UTC). As shown in FIG. 1, the reference signals are inputted into the phase comparator 23.

The digitally controlled oscillator 26 is comprised of an oscillator circuit which can generate signals, and is constructed such that a frequency at which the signal is outputted according to a control signal from an external device. The signals outputted from the digitally controlled oscillator 26 are inputted into a frequency divider 27. Note that the digitally controlled oscillator 26 of this embodiment is comprised of semiconductor(s), and, specifically, is constructed as a ring oscillator which generates the signals from a phase conversion element and delay elements connected with each other in a ring shape.

As shown in FIG. 2, the ring oscillator includes a plurality of delay elements 41, an inverter 42, and a selector 43. Note that, in the configuration of FIG. 2, it is not limited to that only one inverter 42 is provided, but odd number of the inverters may be arranged.

Signals which passed a first delay element 41 (delay element 41 at the left end of FIG. 2) among the delay elements 41 connected in series are outputted to the selector 43 while they are outputted to a second delay element 41. Similarly, signals which passed the second delay element 41 are outputted to the selector 43 while they are outputted to a third delay element 41. In the ring oscillator, a number of the delay elements are arranged in the above configuration. Note that signals which passed the delay element 41 at the right end of FIG. 2 are outputted only to the selector 43.

The selector 43 is provided with the same number of delay signal input units (not illustrated) as the number of the delay elements 41. The selector 43 selects one of the delay signal input units based on the control signal inputted from a control signal input terminal 44, and outputs the signal inputted from the delay signal input units to a later stage. Note that, since selecting by the selector 43 is equivalent to selecting one of the multistage delay elements 41 arranged in series to be extracted, it is referred to as "selecting the number of delay element stages" in the description below. Moreover, performing the selection so that signals which passed "n" delay elements 41 are outputted from the selector 43 is referred especially to as "selecting 'n' delay element stages."

The signal selected as a selection of one of them by the selector 43 is outputted to the frequency divider 27 from the signal output terminal 45, and is returned to the first delay element 41 through the inverter 42. The inverter 42 inverts a level of the signal from High (H) to Low (L) or from L to H. The signal which output is inverted passes through the delay element 41 and the selector 43 like the above, and is outputted to a signal output terminal 45. Moreover, the output from the selector 43 is again returned to the first delay element 41 after it is inverted by the inverter 42.

By the operation being repeated, alternate signals where the level of the signal changes to H, L, H, L, . . . can be generated and outputted to the signal output terminal 45. Moreover, frequencies of the alternate signals can be adjusted by selecting the number of delay element stages by the selector 43.

The frequency divider 27 is constructed so that the divider 27 divides the frequency of the signal inputted from the digitally controlled oscillator 26 to convert it into a low frequency signal from a high frequency signal, and outputs the acquired signal for phase-comparison to the phase comparator 23. For example, when the signal outputted from the digitally controlled oscillator 26 as a reference frequency signal is 10 MHz, the frequency divider 27 divides the frequency of the signal at 10 MHz outputted from the digitally controlled oscillator 26 by a frequency division ratio of 1/10,000,000 to generate the 1 Hz phase comparison signal.

The phase comparator 23 is constructed so that it measures a phase difference from the phase comparison signal by using a TDC (Time to Digital Convertor), and outputs a signal based on the phase difference (phase difference signal). The phase difference signal outputted from the phase comparator 23 is inputted into the loop filter 24.

The phase comparator 23 of this embodiment is provided with the delay elements, and is constructed as a phase comparator which measures the phase difference using delay amounts of the delay elements. Describing with reference to FIG. 3, the phase comparator 23 includes a plurality of flip-flops 51, the plurality of phase comparison delay elements 52, and a phase difference signal calculator 53. Moreover, from a replica signal input terminal 54, the above-described phase comparison signal (replica signal) which is obtained by the frequency divider 27 dividing the frequency of the signal outputted from the digitally controlled oscillator 26 is inputted. On the other hand, from a reference signal input terminal 55, the reference signal outputted from the GPS receiver 21 is inputted.

The inputted replica signal is inputted into a first flip-flop 51 (flip-flop 51 at the left end of FIG. 3), and outputted to a first phase comparison delay element 52 (phase comparison delay element 52 at the left end of FIG. 3). Similarly, the replica signal which passed the first phase comparison delay element 52 is outputted to a second flip-flop 51, and outputted to a second phase comparison delay element 52. In the TDC, a number of the above configurations are repeated. Note that the replica signal which passed the phase comparison delay element 52 at the right end of FIG. 3 is outputted only to the flip-flop 51 at the right end of FIG. 3.

Because of a signal delay action by each of the phase comparison delay elements 52, there is a time lag corresponding to delay amounts of the phase comparison delay elements 52, from the replica signal being inputted into a certain flip-flop 51 to another replica signal being inputted into the next flip-flop 51. On the other hand, a reference signal is simultaneously inputted to the plurality of flip-flops 51. Each flip-flop 51 outputs the signal level (H or L) inputted into the flip-flop 51 from the phase comparison delay element 52 when a reference signal rises (a timing at which the signal output changes from L to H) to the phase difference signal calculator 53. Then, until the reference signal rises again, the previous signal outputs (output of the replica signal when the last reference signal rises) are maintained as the outputs from the flip-flops 51 to the phase difference signal calculator 53.

The phase difference signal calculator 53 examines the output signal of each of the flip-flops 51 to grasp a phase difference between the reference signal and the replica signal as a reference of the delay amount per phase comparison delay element 52. The phase difference signal calculator 53 finds the phase difference, and based on this, outputs a signal (phase difference signal) to a phase difference signal output terminal 56. The phase difference signal is outputted to the loop filter 24 from the phase difference signal output terminal 56.

Next, a method of measuring the phase differences by using the phase comparison delay elements 52 is particularly described using FIG. 4. Note that, below, in order to simplify the description, it is assumed that the delay amounts of the respective phase comparison delay elements 52 (intervals of the dashed lines in FIG. 4) are equal. Moreover, the replica signal and the reference signal are a pulse wave of every one second, and in FIG. 4, and a rising portion of one pulse is extracted and drawn. A waveform shown in FIG. 4 indicates a signal input (H or L) at each time point. D0 to D6 are signals inputted into the respective flip-flops 51, and the replica signal is inputted sequentially, starting from a smaller one in the number.

The waveform of D0 rises at the same time the replica signal is inputted into the replica signal input terminal 54. On the other hand, the signals D1 to D6 are delayed, compared with the replica signal, under the influence that the signal passed the phase comparison delay element 52 from one to six times. As described above, the flip-flop 51 outputs the replica signal which is inputted into the flip-flop 51, at the time of the rise of the reference signal (when changing from L to H). Therefore, if the signal outputs of the flip-flops 51 corresponding to D0 to D6 are expressed with Q0 to Q6, Q0 to Q4 become H, and Q5 and Q6 become L.

The phase difference signal calculator 53 examines the signal outputs of the flip-flops 51 in order of D6, D5, ..., and searches for a location of the change from L to H. And, the signal output changes from L to H between D5 and D4 (Q5=L, Q4=H). Therefore, the reference signal rises between the rise of the replica signal inputted into the flip-flop 51 of D4 and the rise of the replica signal inputted into the flip-flop 51 of D5. As described above, it turns out that the phase difference between the replica signal and the reference signal is in between four to five delay amounts of the phase comparison delay element 52.

The phase difference signal calculator 53 calculates the phase difference based on the above result and the delay amounts of the phase comparison delay elements 52. Note that, in this calculation, as for the delay amounts of the phase comparison delay elements 52, a value calculated in advance during a process of synchronizing the signal of the digitally controlled oscillator 26 with the reference signal generated by the GPS receiver 21 is used. That is, when the phase of the signal outputted from the digitally controlled oscillator 26 is delayed by, for example, "x" stages of the delay elements 41, if it can be determined that the change of the phase difference measured in the TDC corresponds to what number of stages of the phase comparison delay element 52, (since the delay amount per delay element 41 can be calculated by the following equation), the delay amount per phase comparison delay element 52 can be calculated accurately.

The loop filter 24 shown in FIG. 1 is configured so that it determines a synchronizing control signal (first control signal) based on the phase difference signal and outputs the synchronizing control signal. This synchronizing control signal is inputted into the digitally controlled oscillator 26 through the switch circuit 25. The digitally controlled oscillator 26 outputs a signal having a frequency based on the synchronizing control signal outputted from the loop filter 24. By the above, the frequency of the signal outputted from the digitally controlled oscillator 26 is suitably adjusted so that a phase of the phase comparison signal outputted from the frequency divider 27 matches a phase of the reference signal. Moreover, the synchronizing control signal from the loop filter 24 is also inputted into the controller 22.

The detector 28 is configured so as to detect an environmental value indicative of an environment where the digitally controlled oscillator 26 is used. The environmental value detected by the detector 28 is inputted into the controller 22. The detector 28 of this embodiment is constructed as a voltage sensor and a temperature sensor, and it is constructed to detect a voltage value and a temperature for which the digitally controlled oscillator 26 is used as the environmental values. Note that the voltage to be detected by the voltage sensor may be a voltage of a power supply which supplies electric power to the digitally controlled oscillator 26, or an internal voltage of the digitally controlled oscillator 26.

The controller 22 controls the frequency of the signal outputted from the digitally controlled oscillator 26, and is provided with a CPU as an operation unit. Moreover, the controller 22 monitors whether the reference signal is stably supplied from the GPS receiver 21. When it determines that the reference signal is supplied, the controller 22 transmits a switching control signal to the switch circuit 25 to connect the loop filter 24 with the digitally controlled oscillator 26.

A memory unit 29 is configured to store various kinds of data required for the controller 22 controlling the digitally controlled oscillator 26 (for example, environmental related control information, described later).

With the above configuration, while the GPS receiver 21 receives positioning signals from GPS Satellites and generates the reference signal, the loop filter 24 and the digitally controlled oscillator 26 are connected through the switch circuit 25. The digitally controlled oscillator 26 is controlled so that a loop of PLL circuits 31 is formed and the signal outputted from the digitally controlled oscillator 26 synchronizes with the reference signal. Thus, the reference frequency signal is outputted from a first output terminal 33, and the timing signal, which is obtained by dividing the frequency of the reference frequency signal, is outputted from a second output terminal 34, respectively.

Here, as for the digitally controlled oscillator 26, the characteristics thereof change with a change in the environment. That is, also when controlling the digitally controlled oscillator 26 by the same control signal to cause it to output the signal, the signal outputted will differ if the voltage or the temperature changes. However, in this embodiment, the signal outputted from the digitally controlled oscillator 26 is controlled to synchronize with the reference signal from the GPS receiver 21. Therefore, as long as the GPS receiver 21 generates the reference signal and the PLL is locked against the reference signal, even if the characteristics of the digitally controlled oscillator 26 change due to the environmental change, the reference frequency signal outputted from the reference frequency generating device 11 is kept constant. Note that, in the following description, the state where the signal outputted from the digitally controlled oscillator 26 is locked in this way by the reference signal and the synchronizing circuit may be referred to as a "stationary state."

In other words, even if the characteristics of the digitally controlled oscillator 26 changes due to the environmental change, since a new synchronizing control signal (control value) is given from the loop filter 24 to the digitally controlled oscillator 26 so that the changes of the characteristics are cancelled out, the frequency and the phase of the output signal from the digitally controlled oscillator 26 are kept constant as a result. Note that, in the following description, information indicating a relation between the control value to control the digitally controlled oscillator 26 in order to keep the output of the digitally controlled oscillator 26 constant, and the environmental value at that time, is referred to as environmental related control information.

This environmental related control information is found after making the system into the stationary state, at the time of the factory shipments of the reference frequency generating device 11, and an actual operation after the shipment. That is, in the stationary state, the signal outputted from the digitally controlled oscillator 26 synchronizes with the highly precise reference signal. In this state, the controller 22 stores a correspondence relation between the voltage value and temperature detected by the detector 28, and the control value contained in the synchronizing control signal determined by the loop filter 24, in the memory unit 29 as the environmental related control information. This environmental related control information is used when determining a holdover control signal described later.

Next, a control when the GPS receiver 21 cannot receive the positioning signals from the GPS Satellites, and it becomes impossible to generate the reference signal is described. When the controller 22 detects that the reference signal is not inputted, it transmits a switching control signal for connecting the controller 22 with the digitally controlled oscillator 26, to the switch circuit 25 and, thus, it shifts to a holdover control. In this holdover control, the controller 22 determines the holdover control signal (second control signal) for controlling the digitally controlled oscillator 26. This holdover control signal is inputted into the digitally controlled oscillator 26 through the switch circuit 25 switched by the reception of the switching control signal. The digitally controlled oscillator 26 outputs a signal based on the holdover control signal from the controller 22.

In the holdover control, the controller 22 calculates the control value by applying the voltage value and temperature detected by the detector 28 to the environmental related control information (more specifically, the correspondence relation, as described above), and based on this, it generates the holdover control signal. Therefore, since the holdover control signal according to the voltage and temperature is given to the digitally controlled oscillator 26, the reference frequency signal can be generated in good accuracy even in the holdover control.

Next, a method of calculating the environmental related control information is particularly described. Note that, in the following description, the signal outputted from the digitally controlled oscillator 26 may be referred to as an oscillation signal, and a frequency of the oscillation signal may be referred to as an oscillating frequency.

The digitally controlled oscillator 26 of this embodiment is comprised of a ring oscillator, and in order for a signal to circulate within a ring-shaped circuit of the ring oscillator one time, it requires a time of the delay amount with the number of delay element stages selected by the loop filter 24. Since it becomes one cycle of the oscillation signal while the signals of H and L circulate the ring-shaped circuit one time, respectively, the oscillating frequency $F_{OSC}$ will be an inverted value of a doubled value of a value obtained by multiplying the delay amount T per delay element 41 by the number n of delay element stages selected by the loop filter 24 ($F_{OSC}=1/(2 \times n \times T)$). Moreover, since the delay amount T of the delay element 41 changes if the internal voltage or temperature of the digitally controlled oscillator 26 changes, the oscillating frequency also changes. In consideration of this, in this embodiment, the environmental related control information stored in the memory unit 29 is information indicative of a relation between the delay amount T per delay element, and the voltage value and temperature.

Moreover, the delay amount T per delay element 41 can be expressed as the sum of a polynomial function $T_V$ where the voltage value is a variable, a polynomial function $T_T$ where the temperature is a variable, and an individual value (constant) $T_C$ which is produced from, for example, a difference of conditions of the manufacture process of the semiconductor ($T=T_V+T_T+T_C$). Note that, below, the function expressed by the equation is referred to as a delay characteristic function. In this embodiment, the delay characteristic function as the environmental related control information is determined at the time of the factory shipments of the reference frequency generating device 11, and is corrected as needed when the device is operated after the shipment as well.

Describing a case where the delay characteristic function is determined at the time of factory shipments, a factory worker first sets the conditions of the temperature and voltage value of the digitally controlled oscillator 26 to suitable values, and actually operates the reference frequency generating device 11 in an environment where GPS radio waves can be suitably received. Then, the ring oscillator operates so that it selects N stages as the number of delay element stages only for M times among (M+1) times, according to the synchronizing control signal from the loop filter 24, and selects (N+1) stages for the remaining one time. And as a result, if the phase difference which the phase comparator 23 detects becomes zero (i.e., the reference signal is synchronized with the oscillation signal), the controller 22 determines that the synchronization by the PLL circuit 31 has been obtained (it has been in the stationary state), and calculates a average value n of the number of delay element stages at that time. This average value n of the number of delay element stages can be roughly calculated from $n=(N \times M+(N+1) \times 1)/(M+1)$.

Next, the controller 22 substitutes the average value n of the number of delay element stages into the equation of $F_{OSC}=1/(2 \times n \times T)$ where $F_{OSC}=10$ MHz is set, to calculate the value of T. The obtained value of T is stored along with the temperature and voltage value at that time in a suitable memory unit.

Next, the factory worker does not change the temperature but slightly changes the voltage value applied to the digitally controlled oscillator 26, and then, the oscillation signal is again synchronized with the reference signal. If the stationary state is detected, the controller 22 again stores the value of T, the voltage value, and the temperature at that time. By repeating this process several times, data indicative of a relation between the delay amount T and the voltage value when the temperature is fixed can be obtained. From this data, the polynomial function $T_V$ indicative of the change of the delay amount due to the voltage value can be obtained by solving simultaneous equations, for example, using a known least-square method.

Next, a factory worker carries out similar operations while slightly changing the temperature but the voltage value is fixed, and based on the obtained data, he/she obtains the polynomial function $T_T$ indicative of the change of the delay amount due to the temperature like the above. Since $T_C$ can also be found if $T_V$ and $T_T$ are found, the delay characteristic function can be obtained by the above. In this embodiment, the controller 22 automatically obtains the delay characteristic function obtained as described above to learn and store it in the memory unit 29.

Note that the delay characteristic function stored in the memory unit 29 in this way is an initial value and, thus, the delay characteristic function is corrected as needed after the start of operation of the reference frequency generating device 11. That is, since the relation between the delay amount T of the delay element 41, and the voltage value and temperature can be obtained like the above if the stationary state is acquired in the reference frequency generating device 11, a new delay characteristic function can be again calculated. The stored content of the memory unit 29 is updated with the newly obtained delay characteristic function. By the above continuous learning processing, the current characteristics of the digitally controlled oscillator 26 can always be reflected to the delay characteristic function.

Then, if it becomes impossible to generate the reference signal during the operation of the reference frequency generating device 11, the controller 22 substitutes the voltage value and temperature detected by the detector 28 to the delay characteristic function to calculate the delay amount T per current delay element 41. Then, the obtained delay amount T is substituted into the equation of $F_{OSC}=1/(2 \times n \times)$ described above, and in addition, $F_{OSC}=10$ MHz is set, an average value n of the number of delay element stages to be given in order to oscillate the ring oscillator accurately at 10 MHz in the current environment is calculated. Next, the controller 22 calculates the control value (specifically, the values of M and N) to operate the ring oscillator in order to achieve the obtained average value n of the number of delay element stages, and it outputs the control value to the ring oscillator as the holdover control signal. Thereby, also in the holdover control which cannot use the reference signal, a high-precision reference frequency signal can be outputted from the digitally controlled oscillator 26.

Note that, in this embodiment, the phase comparator 23, the loop filter 24, the switch circuit 25, the digitally controlled oscillator 26 (ring oscillator), the frequency divider 27, the controller 22, and the memory unit 29 are fabricated as circuits on an FPGA as the semiconductor. Therefore, the effects of the downsizing, cost reduction, and power saving are remarkable.

As shown above, the reference frequency generating device 11 of this embodiment includes the PLL circuit 31, the detector 28, the controller 22, and the memory unit 29. The PLL circuit 31 controls the digitally controlled oscillator 26 by the synchronizing control signal acquired based on the reference signal outputted from the GPS receiver 21. The detector 28 detects the value indicative of the voltage and temperature at which the digitally controlled oscillator 26 is used (environmental values). The memory unit 29 can store the correspondence relation between the synchronizing control signal, and the voltage and temperature when the synchronizing control signal is determined. When the controller 22 becomes impossible to acquire the reference signal, it determines the holdover control signal based on the voltage and temperature detected by the detector 28, and the correspondence relation stored in the memory unit, and controls the digitally controlled oscillator 26.

Thereby, using the digitally controlled oscillator 26 which is comprised of the semiconductors, it can be a configuration in which the usable temperature range is wide and is strong against a shock and vibration. Moreover, since the digitally controlled oscillator 26 with the semiconductors does not change with time, it can suitably maintain the frequency accuracy over a long period of time even when it becomes in the holdover control.

Moreover, in the reference frequency generating device 11 of this embodiment, the correspondence relation stored in the memory unit is calculated in the state where the reference signal is synchronized with the output signal outputted from the digitally controlled oscillator 26 by the PLL circuit 31 (the stationary state).

Thereby, since the correspondence relation can be obtained with high precision, the accuracy in the holdover control further improves.

Moreover in the reference frequency generating device 11 of this embodiment, the digitally controlled oscillator 26 is provided with the delay elements 41.

Thereby, since the frequency outputted from the digitally controlled oscillator 26 is directly controllable, a highly precise reference frequency signal can be outputted.

Moreover, in the reference frequency generating device 11 of this embodiment, the digitally controlled oscillator 26 is constructed as the ring oscillator.

Thereby, since the digitally controlled oscillator 26 can have a configuration which can easily be achieved with the digital control circuits, it can have a much more suitable configuration for the downsizing and mass production.

Moreover, in the reference frequency generating device 11 of this embodiment, the detector 28 detects the voltage value and temperature.

Thereby, the correspondence relation about the environmental factors which are easy to affect the characteristics of the digitally controlled oscillator 26 can be calculated to perform the holdover control.

Moreover, in the reference frequency generating device 11 of this embodiment, the PLL circuit 31 is provided with the phase comparator 23 that measures the phase difference between the reference signal and the signal outputted from the digitally controlled-oscillator 26, by using the TDC.

Thereby, since the phase comparator 23 can have a configuration which is easy achievable with the digital control circuits, it can have a much more suitable configuration for the downsizing and mass production.

Moreover, in the reference frequency generating device 11 of this embodiment, the TDC measures the phase difference by using the delay amount of the phase comparison delay element 52.

Thereby, the phase difference can be measured by high precision by using the phase comparison delay elements 52 having small delay amounts.

Moreover, in the reference frequency generating device 11 of this embodiment, the memory unit 29 stores the correspondence relation in a stage before the device operates for the first time.

Thereby, even when the device shifts to the holdover control immediately after it starts operating, the controller 22 can determine the holdover control signal to control the digitally controlled oscillator 26.

Moreover, in the reference frequency generating device 11 of this embodiment, the stored content of the memory unit 29 can be updated by the correspondence relation which is newly obtained during the operation of the reference frequency generating device 11.

Thereby, the latest characteristics of the digitally controlled oscillator 26 can be reflected to the correspondence relation which is newly obtained.

Moreover, in the reference frequency generating device 11 of this embodiment, the signal outputted from the digitally controlled oscillator 26 is outputted as the reference frequency signal from the first output terminal 33.

Thereby, the highly precise reference frequency signal based on the positioning signals or the correspondence relation can be outputted with a simple configuration.

Figure 5:
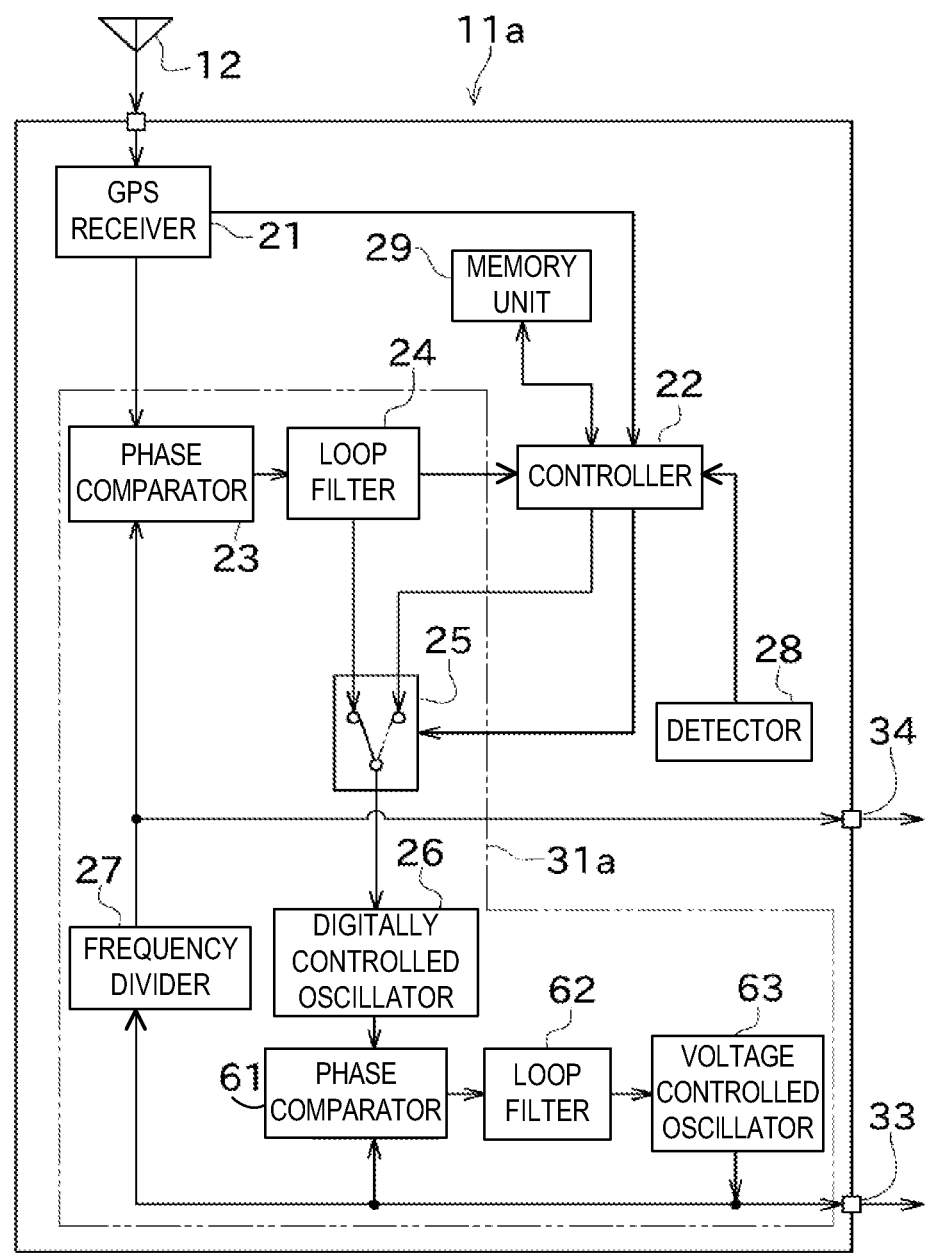
FIG. 5 is a block diagram schematically showing a reference frequency generating device according to a first modification.

Next, modifications of the above embodiment are described. FIG. 5 is a block diagram schematically showing a reference frequency generating device 11a of a first modification, Note that, in the description of this modification, the same numerals are given to identical or similar members in the drawings as those of the embodiment and, thus, description thereof may be omitted.

As shown in FIG. 5, the reference frequency generating device 11a of the first modification has a configuration where a sub PLL circuit (sub synchronizing circuit) is added between the digitally controlled oscillator 26 and the frequency divider 27 in the reference frequency generating device 11 of the above embodiment. This sub PLL circuit constitutes a part of a PLL circuit 31a of the reference frequency generating device 11a, and includes a phase comparator 61, a loop filter 62, and a voltage controlled oscillator 63, as it primary configuration.

The voltage controlled oscillator 63 is a VCXO which uses a crystal oscillator as the resonator, and is constructed so that a frequency to be outputted can be changed according to a level of a voltage applied from an external device. Note that the voltage controlled oscillator 63 may also be constructed as an isothermal-bath type voltage controlled oscillator.

Unlike the above embodiment, the signal outputted from the digitally controlled oscillator 26 is outputted to the phase comparator 61 of the sub PLL circuit in this modification. The phase comparator 61 measures a phase difference between the signal outputted from the digitally controlled oscillator 26 and the signal outputted from the voltage controlled oscillator 63. The phase difference measured by the phase comparator 61 is outputted to the loop filter 62 as the phase difference signal.

The loop filter 62 determines a control voltage signal based on the phase difference signal. Then, the loop filter 62 controls the voltage controlled oscillator 63 by the control voltage signal to generate from the voltage controlled oscillator 63 a signal at the same frequency and the same phase as the signal outputted from the digitally controlled oscillator 26. The signal outputted from the voltage controlled oscillator 63 is outputted to an external device as a reference frequency signal from the first output terminal 33, and is outputted to the frequency divider 27. The signal of which a frequency is divided by the frequency divider 27 is outputted to an external device as a timing signal from the second output terminal 34.

With this configuration, a stable signal without jitter can be outputted to an external device by setting a time constant of the loop filter 62 of the sub PLL circuit longer. Note that, in this modification, since the voltage controlled oscillator 63 (VCXO) is used, a usable temperature range of the device becomes almost equivalent to the conventional range. However, since the reference frequency signal is generated based on the output of the digitally controlled oscillator 26, it can be said that it is still more advantageous in that the signal which is more precise than the conventional device can be outputted even if the holdover control is performed for a long period of time.

As shown above, in the reference frequency generating device 11a of this modification, the PLL circuit 31a is provided with the voltage controlled oscillator 63 which outputs the signal synchronized with the signal outputted from the digitally controlled oscillator 26. Moreover, the signal outputted from the voltage controlled oscillator 63 is outputted as the reference frequency signal from the first output terminal 33.

Thereby, the jitter contained in the output signal of the digitally controlled oscillator 26 can be removed, and the stable reference frequency signal can be outputted.

Figure 6:
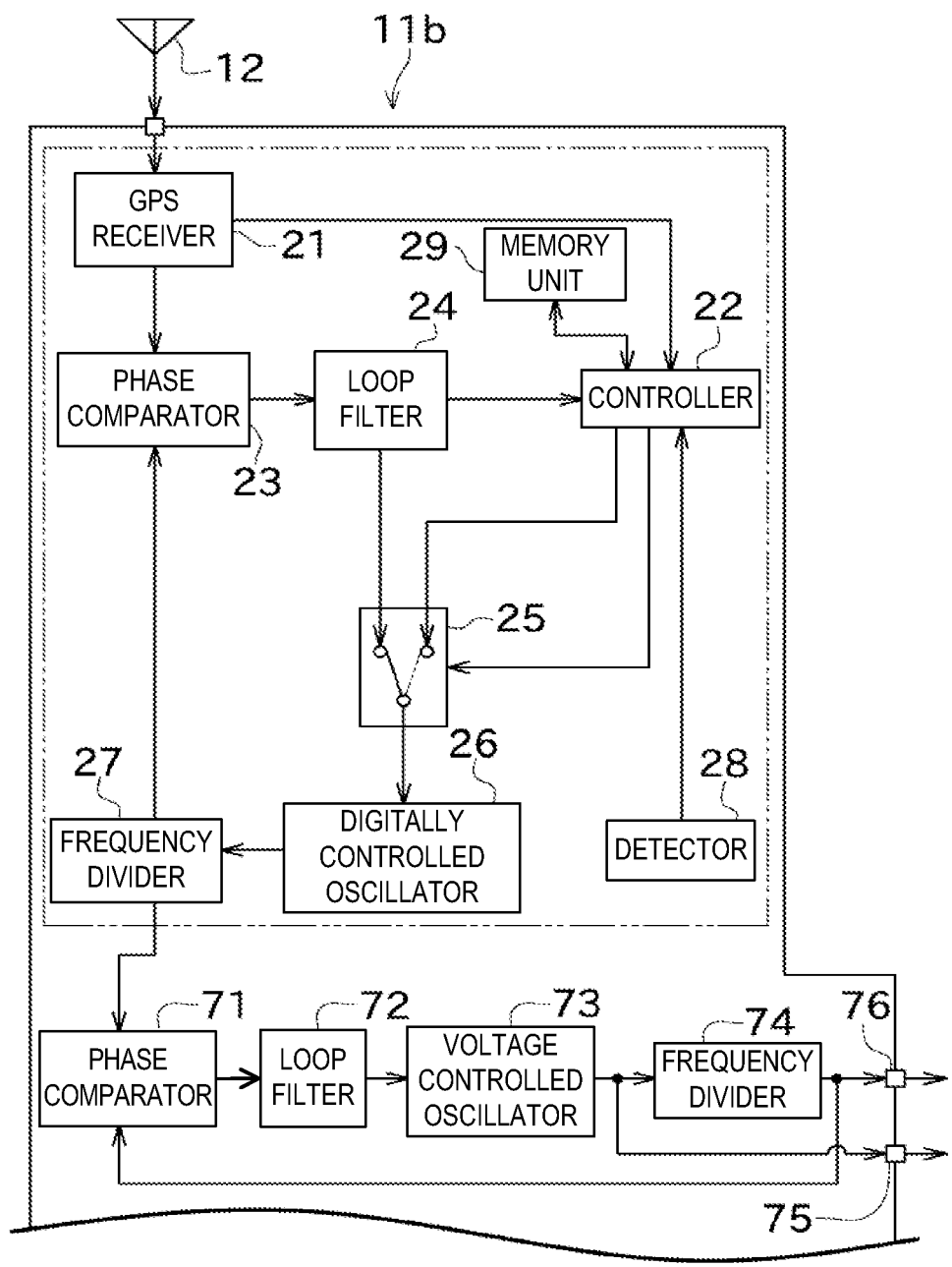
FIG. 6 is a block diagram schematically showing a reference frequency generating device according to a second modification.

Next, a second modification is described. FIG. 6 is a block diagram schematically showing a reference frequency generating device 11b of the second modification. As shown in FIG. 6, the reference frequency generating device 11b of the second modification is what replaced a portion corresponding to the GPS receiver in the conventional reference frequency generating device (a portion shown with a chain line in FIG. 6) with a configuration corresponding to the reference frequency generating device 11 shown in FIG. 1.

Hereafter, this configuration is particularly described. The reference frequency generating device 11b of this modification includes a phase comparator 71, a loop filter 72, a voltage controlled oscillator 73, and a frequency divider 74, as its primary configuration. Note that, since the configuration of the portion enclosed with the chain line in FIG. 6 is completely the same as that of FIG. 1, detailed description thereof is omitted.

In this configuration, a signal outputted from the digitally controlled oscillator 26 is inputted into the phase comparator 71 after the frequency of the signal is divided by the frequency divider 27. The phase comparator 71 measures a phase difference between a signal inputted from the frequency divider 27 and a signal which is obtained by dividing the frequency of the signal by the frequency divider 74 which is outputted from the voltage controlled oscillator 73. The phase difference measured by the phase comparator 71 is outputted to the loop filter 72 as a phase difference signal.

Based on this phase difference signal, the loop filter 72 determines a control voltage signal to the voltage controlled oscillator 73 so that the signals which are frequency-divided by two frequency dividers 27 and 74, respectively, have the same frequency and the same phase. Then, the loop filter 72 controls the voltage controlled oscillator 73 by this control voltage signal to generate a reference frequency signal. The signal outputted from the voltage controlled oscillator 73 is outputted to an external device as the reference frequency signal from the first output terminal 75, and is outputted to the frequency divider 74 as well. The signal frequency-divided by the frequency divider 74 is outputted to an external device as a timing signal from the second output terminal 76.

With this configuration, it can be easily changed to a configuration at low cost, which is excellent in the holdover control, without changing the existing configuration but utilizing most of the existing configuration. Especially, if the portion of the phase comparator 71 is comprised of, for example, an FPGA, in the conventional reference frequency generating device, the configuration of FIG. 6 is also possible to achieve without an addition and change of hardware by re-setting the circuits on the FPGA. Moreover, a stable signal without jitter can be outputted to an external device like the first modification described above.

Although the preferred embodiment and preferred modifications of the present invention are described above, the above configurations may also be modified as follows, for example.

Although the reference frequency generating device 11 of the embodiment has a configuration that generates the reference signal based on the signals from the GPS Satellites, it can be suitably modified as long as it has a configuration of utilizing a GNSS (Global Navigation Satellite System). For example, it can be modified to a configuration which generates the reference signal based on the signals from GLONASS satellites or GALILEO satellites. Furthermore, it may also have a configuration which acquires the reference signal from an external device.

It can be modified to a configuration in which the GPS receiver 21 is arranged outside the reference frequency generating device 11, the reference signal is generated outside the device, and is outputted to the device.

The digitally controlled oscillator 26 is not limited to the ring oscillator, and as long as it has a configuration in which it is a digitized oscillator which can calculate the characteristics based on the environmental values, other digitally controlled oscillators can also be used (for example, oscillators using a capacitor, etc.). In this case, the environmental related control information corresponds to the characteristics of the digitally controlled oscillator. Moreover, the digitally controlled oscillator may be a numerically controlled oscillator, or may be a digitally controlled oscillator other than the numerically controlled oscillator.

The loop filter 24 can be modified to a configuration which outputs the synchronizing control signal by a controller containing at least one of P control, I control, and D control, as long as the digitally controlled oscillator 26 to be used is controllable.

The PLL circuit 31 can also use other synchronizing circuits (an FLL circuit, a DLL circuit, etc.) as long as it has a configuration which controls the digitally controlled oscillator 26 synchronizing with the reference signal supplied.

It may also have a configuration in which the environmental related control information is calculated only at the time of factory shipments and stored in the memory unit 29, but the information is not updated when the device is operated. In this case, since the learning processing is omissible, the load of the controller 22 in the stationary state can be reduced.

When setting the environmental related control information at the time of factory shipments, the delay characteristic function is not calculated while actually changing the voltage value or temperature, but, for example, the configuration may be modified so that a delay characteristic function which is theoretically calculated from the designed values, or a delay characteristic function obtained by experiences, may be stored in the memory unit 29. In this case, setting operation at the time of factory shipments can be simplified.

The detector 28 may be modified so as to measure either one of the voltage value and temperature, instead of measuring both the voltage value and temperature. Moreover, it may be configured so that values relating to other environmental factors are measured.

Although the memory unit 29 stores the correspondence relation between the voltage value and temperature, and the control value contained in the synchronizing control signal, it may be considered that, as for the same voltage value and temperature, a different control value from what was stored before is given to the digitally controlled oscillator 26. In this case, the stored content of the memory unit 29 may be updated with the latest correspondence relation, or the former correspondence relation may still be used without updating the memory unit 29. Moreover, when a plurality of control values are acquired for the same voltage value and temperature, a value acquired by performing various calculation, such as averaging, may also be stored as the correspondence relation. Note that the calculation of the average value may also be performed by selecting only the control values which meet predetermined condition(s). Furthermore, when a variation in the plurality of control values acquired for the same voltage value and temperature is large, the average value may be calculated as described above and the update of the stored content in the memory unit 29 may be continued, and after the control values are stabilized, the update of the stored content may be stopped.

Although the memory unit 29 stores the environmental related control information in the form of a function in the above embodiment, it may also be stored in the form of a look-up table, for example. In the holdover control of this case, the control values corresponding to between plots of the voltage values and temperatures acquired discretely may be calculated by linear interpolation or surface interpolation.

In the above embodiment, when obtaining the relation between the delay amount T per delay element, and the voltage value and temperature, it is considered that all the delay elements have the same amount of delay. However, alternatively, the delay elements may be grouped, and the above relation may be individually obtained for every group. In this case, since the individual specificity of the delay element can be taken to some extent into consideration, a more stabilized control may be possible.

The phase comparator 23, the loop filter 24, the switch circuit 25, the digitally controlled oscillator 26 (ring oscillator), the frequency divider 27, the controller 22, and the memory unit 29 may also be constructed so that they are set as circuits on any programmable logic devices (for example, ASIC) other than the FPGA without any limitation. Moreover, when the GPS receiver 21 is provided with an ASIC, for example, for positioning calculation, the device may also be modified so that the above configuration is set as circuits on the ASIC, and in this case, much greater downsizing and power saving are possible. However, of course, the above configuration may be achieved with an integrated circuit, such as a common IC.

DESCRIPTION OF REFERENCE NUMERALS

11 Reference Frequency Generating Device
21 GPS Receiver
22 Controller
23 Phase Comparator
24 Loop Filter
26 Digitally Controlled Oscillator
27 Frequency Divider
29 Memory Unit
31 PLL Circuit (Synchronizing Circuit)

What is claimed is:

1. A reference frequency generating device, comprising:
   a synchronizing circuit for controlling a digitally controlled oscillator with a first control signal acquired based on a reference signal;
   a detector for detecting an environmental value indicative of an environment where the digitally controlled oscillator is used;
   a memory unit for storing a correspondence relation between a control value of the first control signal and the environmental value when the first control signal is determined; and
   a controller for determining a second control signal based on the environmental value detected by the detector and the correspondence relation stored in the memory unit when the reference signal cannot be acquired, and controlling the digitally controlled oscillator based on the second control signal.

2. The reference frequency generating device of claim 1, wherein the correspondence relation stored in the memory unit is obtained in a state where the reference signal is synchronized with the signal outputted from the digitally controlled oscillator by the synchronizing circuit.

3. The reference frequency generating device of claim 1 or 2, wherein the digitally controlled oscillator includes a delay element.

4. The reference frequency generating device of claim 3, wherein the digitally controlled oscillator is a ring oscillator.

5. The reference frequency generating device of claim 1, wherein the detector detects at least one of a voltage value and a temperature as the environmental value.

6. The reference frequency generating device of claim 1, wherein the synchronizing circuit includes a phase comparator for measuring a phase difference between the reference signal and the signal outputted from the digitally controlled oscillator, by using a TDC.

7. The reference frequency generating device of claim 6, wherein the TDC measures the phase difference using a delay amount of the phase comparison delay element.

8. The reference frequency generating device of claim 1, wherein the memory unit stores the correspondence relation before the reference frequency generating device operates for the first time.

9. The reference frequency generating device of claim 1, wherein the stored content of the memory unit is updatable with the correspondence relation that newly obtained during an operation of the reference frequency generating device.

10. The reference frequency generating device of claim 1, wherein a signal outputted from the digitally controlled oscillator is used as the reference frequency signal.

11. The reference frequency generating device of claim 1, wherein the synchronizing circuit includes a voltage controlled oscillator for outputting a signal that is synchronized with the signal outputted from the digitally controlled oscillator, and
   wherein the signal outputted from the voltage controlled oscillator is used as the reference frequency signal.

* * * * *